(12) United States Patent
Huang

(10) Patent No.: US 6,400,003 B1
(45) Date of Patent: Jun. 4, 2002

(54) HIGH VOLTAGE MOSFET WITH GEOMETRICAL DEPLETION LAYER ENHANCEMENT

(75) Inventor: Eddie Huang, Stockport (GB)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/453,423

(22) Filed: Dec. 2, 1999

(30) Foreign Application Priority Data

Feb. 12, 1998 (GB) .............................................. 9826291

(51) Int. Cl.⁷ ............................................... H01L 31/0352
(52) U.S. Cl. .......................... 257/653; 257/336; 257/339
(58) Field of Search ............................. 253/653; 257/330, 257/339, 141, 336

(56) References Cited

U.S. PATENT DOCUMENTS

| | | | |
|---|---|---|---|
| 4,344,080 A | * 8/1982 | Tihanyi ........................ 257/336 |
| 4,593,302 A | * 6/1986 | Lidow et al. ................ 257/339 |
| 4,754,310 A | 6/1988 | Coe ............................. 357/13 |
| 5,155,574 A | * 10/1992 | Yamaguchi .................. 257/257 |
| 5,191,396 A | * 3/1993 | Lidow et al. ................ 257/339 |
| 5,434,435 A | * 7/1995 | Baliga ......................... 257/141 |
| 5,438,215 A | 8/1995 | Tihanyi ....................... 257/401 |
| 5,473,180 A | 12/1995 | Ludikhuize ................. 257/336 |
| 6,040,600 A | * 3/2000 | Uenishi et al. ............. 257/330 |

* cited by examiner

*Primary Examiner*—Nathan Flynn
*Assistant Examiner*—Tom Dickey
(74) *Attorney, Agent, or Firm*—Steven R. Biren

(57) ABSTRACT

In a field-effect semiconductor device, for example a power MOSFET, a body portion separates a channel-accommodating region from a drain region at a surface of a semiconductor body. This body portion includes a drift region which serves for current flow of charge carriers of a first conductivity type from the conduction channel to the drain region, in a conducting mode of the device. Instead of being a single region, the body portion also includes field-relief regions of the second conductivity type, which are depleted together with the drift region in a voltage blocking mode of the device to provide a voltage-carrying space-charge region. The drain region extends at least partially around the body portion at the surface, and the relief regions are located radially in this body portion.

9 Claims, 3 Drawing Sheets

HIGH VOLTAGE MOSFET WITH GEOMETRICAL DEPLETION LAYER ENHANCEMENT

BACKGROUND OF THE INVENTION

This invention relates to field-effect semiconductor devices, for example power MOSFETs, comprising a semiconductor body including a channel-accommodating region of a second conductivity type between source and rain regions of an opposite first conductivity type.

United States patent specification U.S. Pat. No. 5,438,215 describes several power MOSFETs having a body portion which separates the channel accommodating region from the drain region and which includes first and second additional regions of opposite (first and second) conductivity types. These regions of the body portion together provide a space charge region under the spread of a depletion layer from the channel-accommodating region to the drain region when a blocking voltage is present between the channel-accommodating region and the drain region in one mode of operation of the device. The body portion includes a drift region of the first conductivity type, for current flow of charge carriers of the first conductivity type to the drain region from a conduction channel in the channel-accommodating region in a conducting mode of operation of the device.

These MOSFETs of U.S. Pat. No. 5,438,215 are particular embodiments of the advantageous general device type that was disclosed in United States patent specification U.S. Pat. No. 4,754,310 (our ref: PHB32740). The first and second regions of the body portion serve together to carry the depletion layer from the drain region to the channel-accommodating region in an off state of the device. The second-type region of the body portion acts as a relief region. The first-type region of the body portion provides parallel current paths in a conducting state of the device. A significant improvement is obtained in the relationship between the on-resistance and breakdown voltage of the device, by so providing these first and second regions, instead of a single high-resistivity body portion as conventionally used. The whole contents of both U.S. Pat. Nos. 5,438,215 and 4,754,310 are hereby incorporated herein as reference material.

FIGS. 5 to 7 of U.S. Pat. No. 5,438,215 relate to MOSFETs in which both the body portion and the source and drain regions extend adjacent to a surface of the body. The additional relief regions of the second conductivity type are present in the drift region adjacent to the surface and extend longitudinally towards the drain region. They are spaced at their opposite ends from the channel-accommodating region and the drain region by interconnecting parts of the drift region. Additionally doped regions of the first conductivity type are present between these longitudinal relief regions of the second conductivity type. In the FIG. 7 embodiment, the width of these additionally doped regions of the first conductivity type increases towards the drain region to provide an increasing number of dopant atoms in the direction of the drain region, and thereby to allow a further increase in the breakdown field intensity.

United States patent specification U.S. Pat. No. 5,473,180 (our ref: PHN14508) also describes particular MOSFETs of the advantageous general device type, in which the drift region (termed the "drain extension region") comprises a plurality of zones whose width may increase from the channel-accommodating region to the drain region, at the same surface of the body. Several advantageous geometries with increasing-width zones are disclosed in U.S. Pat. No. 5,473,180. The whole contents of U.S. Pat. No. 5,473,180 are hereby incorporated herein as reference material.

SUMMARY OF THE INVENTION

It is an aim of the present invention to provide a field-effect semiconductor device which is of the advantageous device type (wherein depleted opposite-conductivity-type regions of a body portion provide the space-charge region) and in which the spread of the depletion layer in the body portion is improved by the geometrical layout of the relief regions of the second conductivity type.

According to the present invention, there is provided a field-effect semiconductor device having the features set out in Claim 1.

Devices in accordance with the present invention have source and drain regions that are arranged concentrically so as to provide the body portion with an increase in its available layout area towards the drain region. Thus, the drain region is a surrounding region that extends (partially or entirely) around the body portion at the surface of the body. The relief regions are located radially in this body portion. The increased layout area towards the surrounding drain region readily permits the spacing between neighbouring relief regions of the second conductivity type to increase in the radial direction from the channel-accommodating region towards the surrounding drain region.

Their increasing spacing permits the radial relief regions to be formed with a doping concentration (of the second conductivity type) that is compatible with the different functions of these regions towards opposite ends of the body portion. At the end towards the channel-accommodating region, the radial relief regions of the second conductivity type are closely spaced and so they reinforce each other in their depletion of the drift region at this end. Thus, a moderate doping concentration of the second conductivity type for these relief regions can be high enough to give a strong electric-field push to spread the depletion layer away from the channel-accommodating region. Where they are widely spaced at the other end towards the drain region, this moderate doping concentration is low enough to permit full depletion of the relief regions when the full breakdown voltage is being supported by the spread of the depletion layer in the vicinity of the drain region. The adoption of these increasingly-spaced radially-arranged relief regions in this concentric arrangement permits a near-optimum field distribution to be achieved in the body portion, with a maximum field-relief adjacent to the channel-accommodating region.

The device may comprise a single concentric device cell in the semiconductor body. However its concentric/radial geometry can be adopted readily in a power device configuration, comprising a multicellular array of the body portions side-by-side, with the drain region extending as a mesh between the neighbouring body portions. The drain region may have a polygonal outline facing the body portion at the surface. The depletion layer can be spread into the internal corners of the polygonal outline by directing the relief regions radially towards the polygonal outline, for example towards its internal corners.

The drift region of the first conductivity type may also extend under the radial relief regions of the second conductivity type. In this case, the body region may further include an underlying region of the second conductivity type which underlies the drift region and which forms a p-n junction with the drift region. This underlying region may have a very low doping concentration of the second conductivity type, so permitting it to accommodate some of the depletion when the full breakdown voltage is being supported by the spread of the depletion layer in the vicinity of the drain region. Thus, the space charge region may extend into the radial relief regions, and/or the drift region and/or an adjacent part of the underlying region. The present invention permits the doping of the underlying region to be very low. Although it may be too low to give a strong push to the depletion layer away from the channel-accommodating region, an adequate push is provided instead by the high doping and closely spacing of the radial relief regions of the second conductivity type in the vicinity of the channel-accommodating region.

BRIEF DESCRIPTION OF THE DRAWINGS

Embodiments of the present invention are now described, by way of example, with reference to the accompanying diagrammatic drawings, in which.

Figure 1:
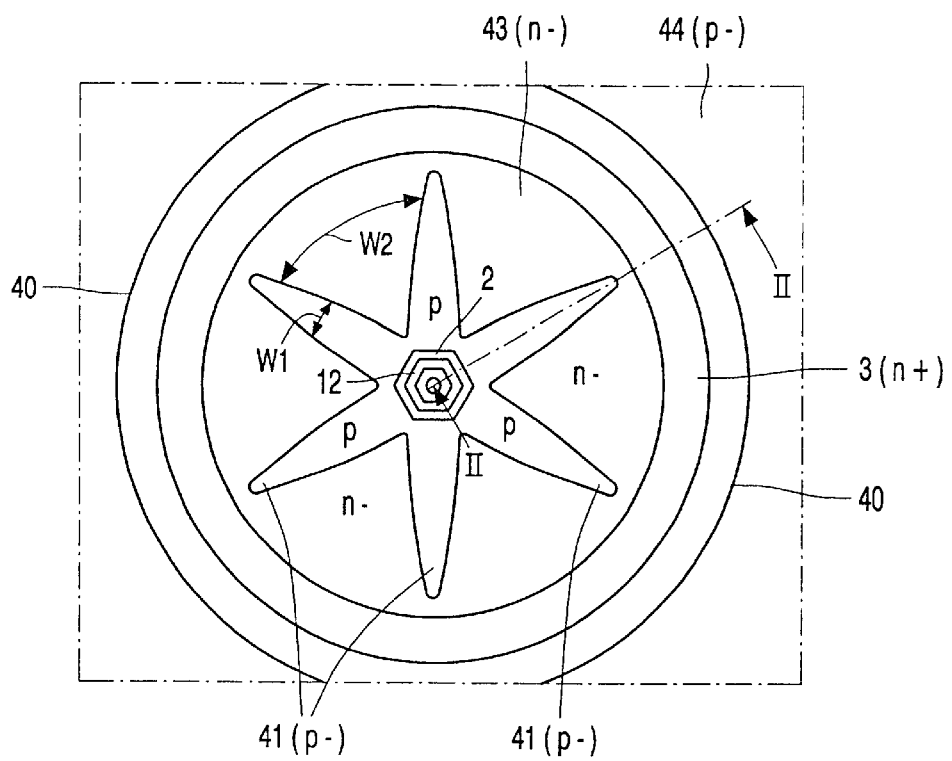
FIG. 1 is a plan view of an active central part of one example of a field-effect semiconductor device in accordance with the invention.

It should be noted that all the Figures are diagrammatic, with relative dimensions and proportions of parts of the drawings shown exaggerated or reduced in size, for the sake of clarity and convenience in the drawings. Furthermore, electrodes and insulating layers are omitted from the plan views of FIGS. 1, 3, 4 and 5, for simplicity in the drawings. The same reference signs are generally used to refer to corresponding or similar features in modified and different embodiments.

DESCRIPTION OF THE PREFERRED EMBODIMENTS

Figure 2:
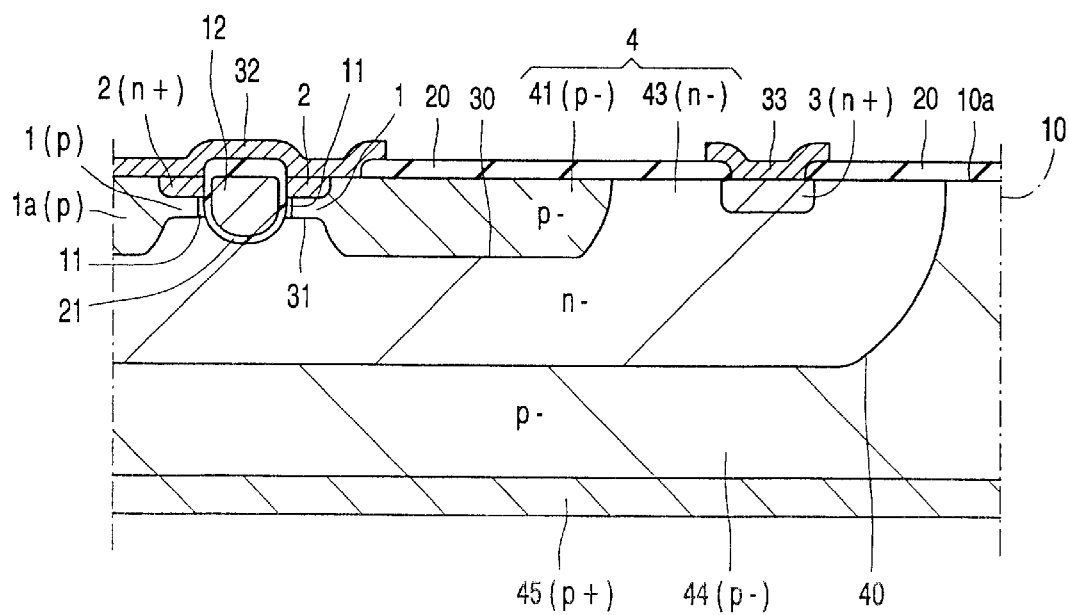
FIG. 2 is a cross-sectional view on the line II—II of FIG. 1.

The field-effect semiconductor device of FIGS. 1 and 2 is a high voltage MOSFET comprising a semiconductor body 10, typically of monocrystalline silicon. It includes a channel-accommodating region 1 of a second conductivity type (p-type in the specific example as illustrated) between source and drain regions 2 and 3 of an opposite, first conductivity type (n-type). A body portion 4 separates the channel-accommodating region 1 from the drain region 3. Both the body portion 4 and the source and drain regions 2 and 3 extend adjacent to a surface 10a of the body 10. An insulating layer 20 is present on the surface 10a. Source and drain electrodes 32 and 33 contact respectively the source and drain regions 2 and 3 at windows in the insulating layer 20. Typically the source electrode 32 may also contact the channel-accommodating region 1 via a more highly doped (P+) contact region 1a.

The device is operated between a conducting mode and a voltage-blocking mode, by applying different signals to a gate 12 in known manner. Thus, the device comprises an insulated gate 12 that is capacitively coupled to the region 1 via an intermediate insulating layer 21. In the specific example of FIGS. 1 and 2, the device is of the trench-gate type, having its gate 12 in a trench extending from the surface 10a through the region 1. In the conducting mode of operation, a conduction channel 11 (of electrons in this specific example) is formed in the region 1 by the gate signal in a normal MOS manner. The body portion 4 includes a drift region 43 of the first conductivity type (n-type), with a lower doping than the drain region. The region 1 forms a p-n junction 31 with the region 43. The p-n junction 31 is reverse-biased by the voltage applied between the source and drain electrodes 32 and 33. The drift region 43 serves for current flow of the charge carriers of the first conductivity type (electrons) from the conduction channel 11 to the drain region 3. In the specific example of FIGS. 1 and 2, the drain region 3 is a more highly doped region present in the drift region 43.

The body portion 4 also includes field-relief regions 41 of the second conductivity type (p-type, in this example). The regions 41 are present in the drift region 43 adjacent to the surface 10a and form a p-n junction 30 with the region 43. As can be seen from FIGS. 1 and 2, these relief regions 41 are regions 41a of longitudinal geometry in this example; and they extend longitudinally from adjacent to the channel-accommodating region 1 to adjacent to the drain region 3. The regions 41 and 43 of the body portion 4 together provide part of a voltage-carrying space-charge region, under the spread of a depletion layer from the p-n junction 31 in the voltage blocking mode of operation of the device. This occurs when no conduction channel 11 is formed by the applied gate signal. In this situation the voltage present between the main electrodes 32 and 33 of the device becomes a blocking voltage to be carried in the depleted body portion 4 between the channel-accommodating region 1 and the drain region 3. The regions 41 and 43 are each depleted across their entire thickness, when sustaining the full blocking voltage. The doping concentrations and thicknesses of these p-type and n-type regions 41 and 43 are chosen accordingly, in known manner (for example as set out in U.S. Pat. Nos. 4,754,310 and 5,438,215) to permit their depletion without exceeding the critical field for avalanche breakdown.

In the device of FIGS. 1 and 2, the field relief and device layout are optimised in accordance with the present invention, by arranging the drain region 3 as a surrounding region (at the surface 10a) that extends around the body portion 4 and the source region 2. Thus, the device has a concentric arrangement of its source and drain regions 2 and 3. This readily permits a layout for the body portion 4, in which the spacing W2 between the neighbouring relief regions 41 increases towards the surrounding drain region 3. In the example illustrated in FIG. 1, the longitudinal relief regions 41a extend radially in the body portion 4 towards the surrounding drain region 3, with a progressively increasing spacing W2. In this example, the surrounding drain region 3 extends entirely around the body portion 4 at the surface 10a. Thus, these longitudinal regions 41a extend radially from the vicinity of the channel-accommodating region 1 in a star-like configuration towards the surrounding drain region 3.

In the device illustrated in FIGS. 1 and 2, the drift region 43 extends under the channel-accommodating region 1 and also under (and between) the relief regions 41. The trench-gate 12 extends through the thickness of the channel-accommodating region 1 from the surface 10a, so as to provide the device of FIGS. 1 and 2 with conduction channels 11 through the thickness of the channel-accommodating region 1. The relief regions 41 extend outward from the channel-accommodating region 1, in this example. The body region 4 (in which the depletion layer spreads for voltage blocking) further includes an underlying region 44 of the second conductivity type (p-type in this example). This region 44 underlies the drift region 43 and forms a p-n junction 40 with the drift region 43. Typically the region 44 may be a low-doped silicon substrate in which the regions 1,2,3. 43 and 44 are provided by, for example, dopant ion implantation via the surface 10a. A highly doped (P+) contact region 45 may be provided at the opposite surface 10b and can be used for connecting the region 44 to the same potential as the source region 2. In this device example, the field relief of the n-type drift region 43 is provided by both the p-type regions 41 and 44 above and below it. The balanced space charge region (formed by the depletion layer in the blocking mode) is accommodated in the relief regions 41, the drift region 43 and an adjacent part of the underlying region 44.

The role of the radial relief regions 41 (and their increasing spacing W2 towards the surrounding drain region 3) will now be discussed in terms of depletion layer spread at the p-n junctions 31, 30 and 40.

Maximum field relief is desired near the channel-accommodating region 1 where the critical field would otherwise occur around the p-n junction 31, and particularly adjacent to the surface 10a. The desired field relief is achieved in this area, because it is this area where the width (spacing W2) of the n-type drift region 43 between the neighbouring p-type relief regions 41 is small. Because of their close spacing, the radial relief regions 41 reinforce each other in their depletion of the drift region 43 at this end. This mutual reinforcement (together with the large width W1 of the p-type relief region 41 in this area near the region 1) pushes the depletion in the n-type drift region 43 to a greater distance from the p-type region 1. Thus, a moderate doping concentration of the second conductivity type (p-type) for these relief regions 41 can be high enough to give a strong electric-field push to spread the depletion layer away from the channel-accommodating region 1.

In the vicinity of the surrounding drain region 3, however, the width (spacing W2) of the n-type drift region 43 between the neighbouring p-type relief regions 41 is large. This increase in W2 is readily accommodated by the increased radial layout area within the surrounding drain geometry. Because of the wide spacing W2 at their ends facing the surrounding drain region 3, the p-type relief regions 41 (with a width W1 much narrower than W2) readily deplete back over a significant distance towards the region 1. In this situation, the moderate doping concentration of the regions 41 is low enough to permit the relief regions 41 to be depleted fully at this end, when the full breakdown voltage is being supported by the spread of the depletion layer in the vicinity of the drain region 3. Furthermore, the drain region 3 does not need to be spaced a large distance from the radial relief regions 41, if the relief regions 41 are narrowed at this end.

This is advantageous for relaxing the design criteria for both the p-type regions 41 and 44. Thus, the underlying p-type region 44 can have a low doping concentration for accommodating the spread of the depletion layer near the drain region 3. This low doping concentration for the region 44 may be so low that it gives little (if any) push to the depletion layer in the drift region 43, near the channel-accommodating region 1. However, at this end towards the region 1, the closely-spaced radial relief regions 41 provide a strong push to spread the depletion layer along the drift region 41, away from the channel-accommodating region 1.

Thus, by means of this radial arrangement of the increasingly-spaced relief regions 41 towards a surrounding drain region 3, a near-optimum field distribution can be achieved in the body portion 4. A laterally varying degree of field relief is achieved, with a maximum field-relief adjacent to the channel-accommodating region 1. With this radial arrangement, there is no need to vary the doping concentration (P−) laterally in the underlying relief region 44. Furthermore, the drift region 43 may have a single doping profile of the first conductivity type (n-type, in this example). Thus, the drift region may have a doping concentration (of the first conductivity type) that is higher than the doping concentration of the second conductivity type (p-type) of the underlying region 44 and that is lower than the doping concentration of the second conductivity type (p-type) of the relief regions 41. This device structure can be readily manufactured. If so desired, the on-resistance through the drift region 43 may be reduced further by an additional doping concentration (N) implanted in the region 43 between the neighbouring relief regions 41.

The geometry of the increasingly-spaced radially-arranged relief regions 41 (their shape and precise location) can be chosen so as to enhance these desired effects. By so modifying the geometry, there is no need to modify laterally the doping concentration of the regions 41 and 44. Thus, for example, the shape and/or dimensions of (at least some of) the relief regions 41 may vary with their lateral location. As illustrated towards their free ends in FIGS. 1, 4 and 5, the width WI of the longitudinal regions 41 a may decrease towards the surrounding drain region 3. However, the width W1 of the regions 41a may be increased towards the surrounding drain region 3 (to give an increased push in this area) if their spacing W2 would otherwise be too great in this area, having regard to given doping concentrations and dimensions. Furthermore, instead of being integrally connected to the channel-accommodating region 1, at least some of the relief regions 41 may be separate, at a floating potential. Thus, the regions 41 may comprise an inhomogeneous distribution of island regions 41b, 41c of the second conductivity type (p-type) in-between the channel-accommodating region 1 and the drain region 3. These island relief regions 41b, 41c may be provided instead of, or in addition to, longitudinal regions 41a.

Figure 3:
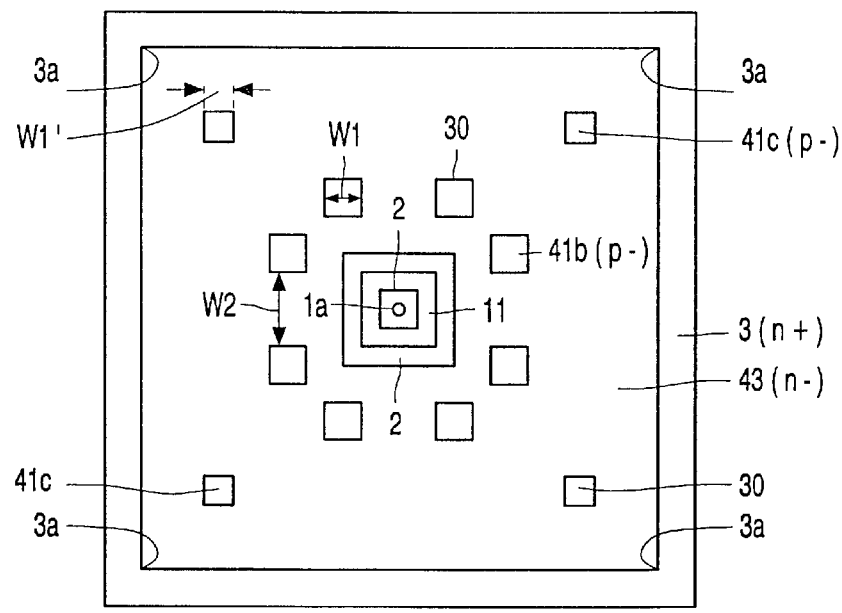
FIG. 3 is a plan view of an active central part of another example of a field-effect semiconductor device in accordance with the invention.
Figure 5:
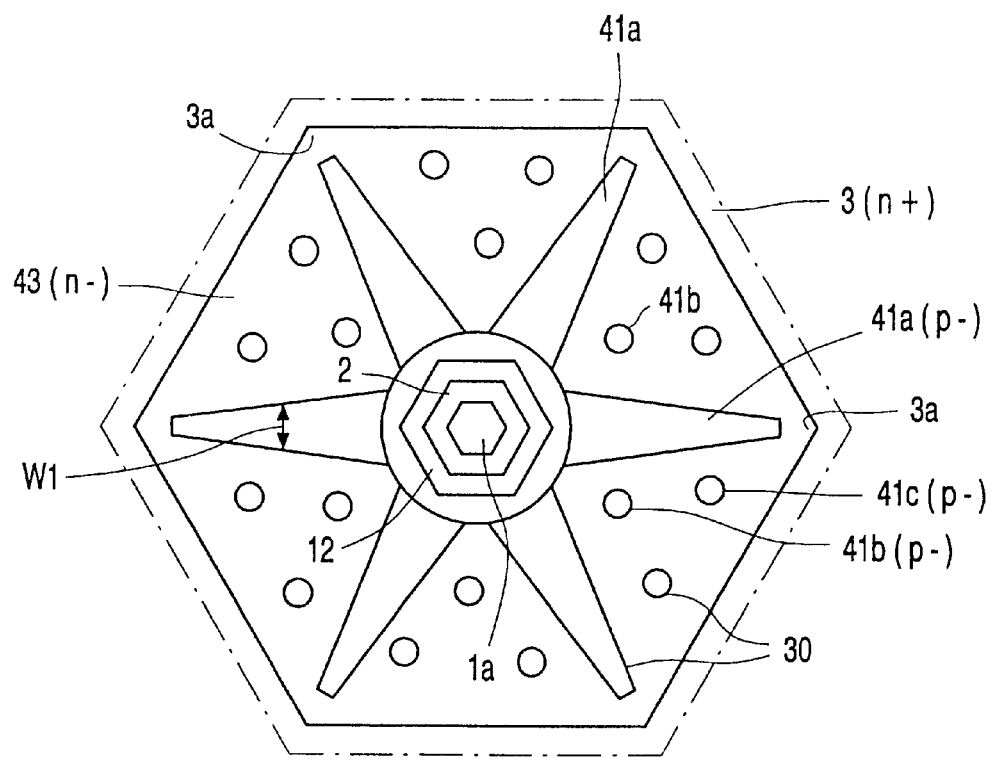
FIG. 5 is a plan view of an active central part of a variant example of a field-effect semiconductor device in accordance with the invention.

FIG. 3 illustrates a device in which all the relief regions 41 are island regions 41b and 41c. In this device, the distribution density of these island regions 41b and 41c decreases from the channel-accommodating region 1 towards the drain region 3. Furthermore, FIG. 3 illustrates an example in which the width W1 of the relief regions 41 decreases towards the surrounding drain region 3, the regions 41c nearer drain region 3 having a smaller width W1'. FIG. 5 illustrates a device in which some of the relief regions 41 are longitudinal regions 41a and some are island regions 41b and 41c. The main regions 41a have the major effect in spreading the depletion layer in the FIG. 5 device, whereas the smaller regions 41b and 41c are located where it is desired to provide local, extra field relief, by reducing locally high intensities in the electric field.

Figure 4:
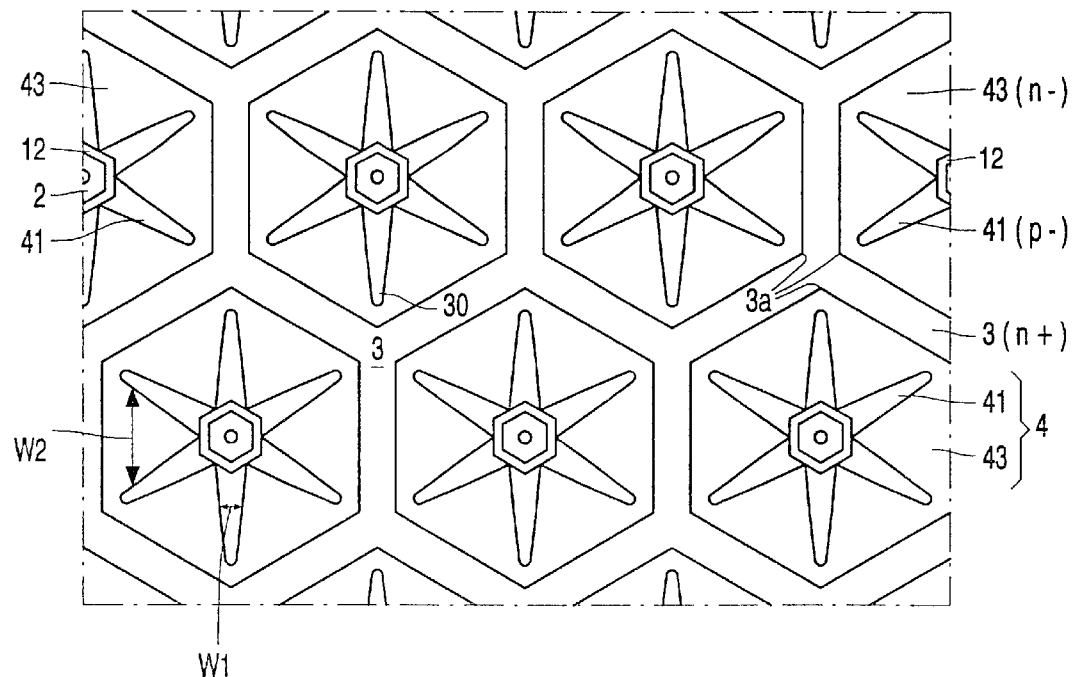
FIG. 4 is a plan view of an active central part of further example of a field-effect semiconductor device in accordance with the invention.

The device of FIG. 1 is of circular geometry for the drain region 3. The gate 12, channel-accommodating region 1 and source region 2 may also be of circular layout geometry, although they are illustrated with an exemplary hexagonal geometry in FIG. 1. FIGS. 3, 4 and 5 illustrate examples of devices having polygonal geometries, in which the drain region 3 has a polygonal outline facing the body portion 4 at the surface 10a. In each of these examples, the relief regions 41 extend radially towards internal corners of the polygonal outline. The polygonal outline is square in FIG. 3 and hexagonal in FIGS. 4 and 5. FIG. 3 illustrates a specific example in which the island regions 41b and 41c are also square. In FIG. 5, however, circular island regions are illustrated as an example.

Such device configurations having increasingly-spaced relief regions 41 radially-arranged towards a surrounding drain region 3 may be used in a multicellular array. One such multi-cellular array is illustrated in FIG. 4, by way of an example using a close-packed hexagonal array layout. In such devices, the drain region 3 has a mesh shape that extends between neighbouring side-by-side body portions 4 at the surface 10a. Each side-by-side body portion 4 extends around a respective channel-accommodating region 1 and source region 2 of the device. Such a configuration can be used with drain-region meshes built up of the hexagonal or square outlines (around the body portions 4) of FIG. 5 or FIG. 3, or even a circular outline similar to FIG. 1.

In the device of FIG. 2, the relief regions 41 are formed by over-doping parts of the drift region 43. However, the relief regions 41 may be formed by parts of the substrate 44 which extend to the surface 10a in-between the radially-extending longitudinal zones of the drift region 43. In this case, similar fabrication steps to those in U.S. Pat. No. 5,473,180 can be used for forming the longitudinal zones of the drift region 43 by over-doping parts of the substrate region 44, while masking the intermediate relief regions 41 of the substrate region 44. However the resulting device geometry in accordance with the present invention has the drain region 3 extending at least partially around the resulting body portion 4 (with its regions 41 and 43) at the surface 10a. These relief regions 43 (of the substrate region 44) are radially located, with an increasing spacing W2 towards the surrounding drain region 3.

Figure 6:
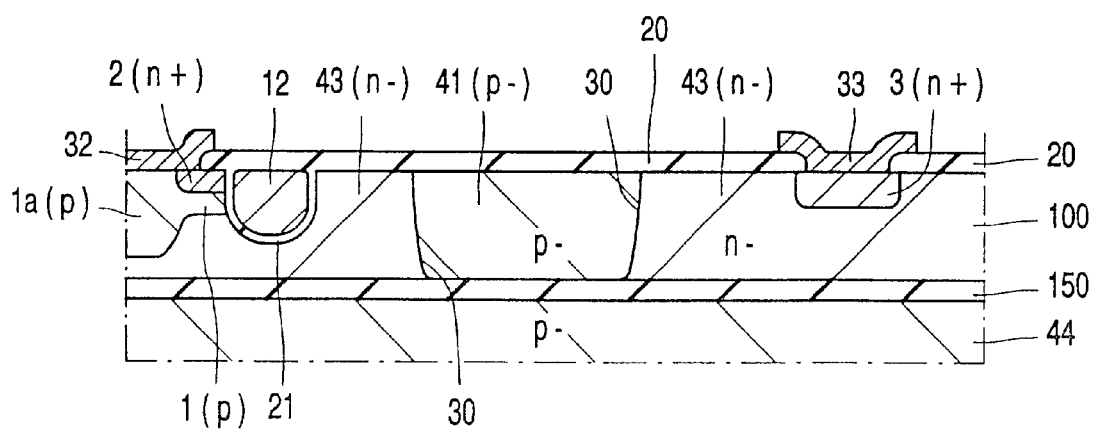
FIG. 6 is a cross-sectional view, similar to FIG. 2, of an active central part of another variant example of a field-effect semiconductor device in accordance with the invention.

In the device of FIG. 2, the substrate region 44 forms a p-n junction 40 with the drain drift region 43. FIG. 6 illustrates a variant construction in which the semiconductor body 10 comprises a semiconductor layer 100 on an underlying region 150 of electrically insulating material, for example silicon dioxide. This region 150 insulates the semiconductor layer 100 (with its device regions 1, 2, 3, 41, 43 etc.) from an underlying semiconductor substrate region 44. This type of device structure is sometimes termed "SCI" for Semiconductor On Insulator. The device configurations of any of FIGS. 1, 3, 4, and 5 may be implemented also in this SOI type of device structure. In the FIG. 6 device, the relief regions 41 and the drift region 43 extend through the thickness of the semiconductor layer 100 to the underlying region 150 of electrically insulating material. The drift region 43 can be partly depleted from the radial relief regions 41 as described above, and also partly depleted by MOS action across the insulating region 150 from the substrate region 44. The semiconductor layer 100 generally needs to be thin to permit this depletion from across the insulating region 150. Thus, in general, the SOI construction places more restriction on the thickness of the device regions, and so is more limiting than the FIG. 2 construction.

Although trench-gate devices have been illustrated, the gate 12 may be of the planar form, being present on a gate insulating layer 21 on the body surface 10a. Furthermore, a junction gate 12 (that forms a p-n junction with the channel-accommodating region 1) may be used instead of an insulated gate 12.

From reading the present disclosure, other variations and modifications will be apparent to persons skilled in the art. Such variations and modifications may involve equivalent and other features which are already known in the design, manufacture and use of semiconductor devices, and component parts thereof, and which may be used instead of or in addition to features already described herein. Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. The Applicants hereby give notice that new Claims may be formulated to any such features and/or combinations of such features during the prosecution of the present Application or of any further Application derived therefrom.

What is claimed is:

1. A field-effect semiconductor device comprising a semiconductor body including a channel-accommodating region of a second conductivity type between source and drain regions of an opposite first conductivity type, wherein a body portion separates the channel-accommodating region from the drain region, both the body portion and the source and drain regions extending adjacent to a surface of the body, the body portion includes a drift region of the first conductivity type for current flow of charge carriers of the first conductivity type to the drain region from a conduction channel in the channel-accommodating region in a conducting mode of operation of the device, and the body portion also includes relief regions of the second conductivity type which are present in the drift region adjacent to the surface, the relief regions and the drift region of the body portion together providing a space charge region under the spread of a depletion layer from the channel-accommodating region to the drain region when a blocking voltage is present between the channel-accommodating region and the drain region in one mode of operation of the device, wherein the semiconductor device comprises a concentric arrangement of the source and drain regions at the surface of the body, in which the drain region extends at least partially around the body portion and the source region, in which the spacing between neighbouring relief regions increases from the channel-accommodating region towards the drain region, and in which the width of at least some of the relief regions decreases towards the drain region.

2. A device as claimed in claim 1, further characterised in that the drain region extends entirely around the body portion at the surface of the body, and in that the relief regions extend radially from the vicinity of the channel-accommodating region towards the drain region.

3. A device as claimed in claim 2, further characterised in that the drain region has a polygonal outline facing the body portion at the surface, and in that the relief regions extend radially towards the polygonal outline.

4. A device as claimed in claim 3, further characterised in that the polygonal outline is either hexagonal or square.

5. A device as claimed in claim 1, further characterised in that the drain region has a mesh shape that extends between neighbouring side-by-side body portions at the surface of the body, and in that each side-by-side body portion extends around a respective channel-accommodating region and source region of the device.

6. A device as claimed in claim 1, further characterised in that the relief regions comprise an inhomogeneous distribution of island regions of the second conductivity type in-between the channel-accommodating region and the drain region, and in that the distribution density of the island regions decreases from the channel-accommodating region to the drain region.

7. A device as claimed in claim 1, further characterised in that at least some of the relief regions extend outward from the channel-accommodating region, and in that a trench-gate extends through the thickness of the channel-accommodating region from the surface to provide the device with conduction channels through the thickness of the channel-accommodating region.

8. A device as claimed in claim 1, further characterised in that the semiconductor body comprises a semiconductor layer on an underlying region of electrically insulating material, and in that the relief regions and the drift region extend through the thickness of the semiconductor layer to the underlying region of electrically insulating material.

9. A device as claimed in claim 1, further characterised in that the drift region also extends under the relief regions, and the body region further includes an underlying region of the second conductivity type which underlies the drift region and which forms a p-n junction with the drift region, and in that a space charge region is provided by the relief regions, the drift region and an adjacent part of the underlying region.

* * * * *